Figure 1:
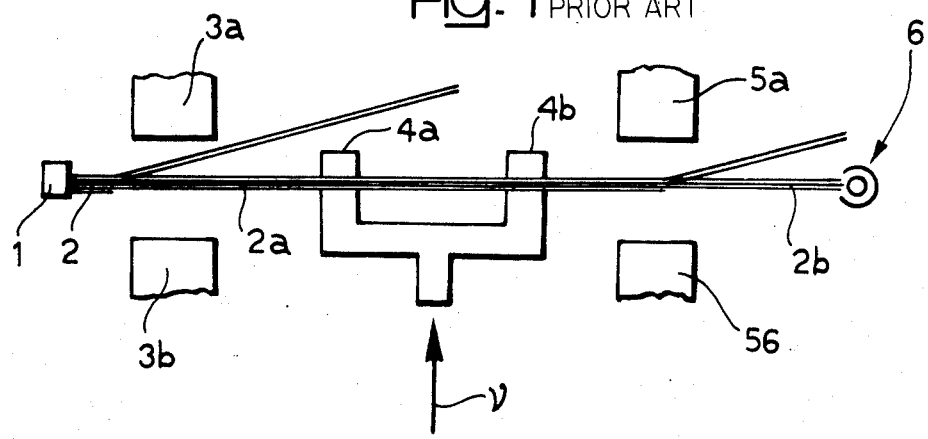

United States Patent [19]

De Marchi et al.

[11] Patent Number: 4,692,716
[45] Date of Patent: Sep. 8, 1987

[54] METHOD AND A DEVICE FOR THE FREQUENCY CONTROL OF AN ATOMIC OR MOLECULAR BEAM FREQUENCY STANDARD

[75] Inventors: Andrea De Marchi, Via Sperino 13, Lessona (Vercelli); Giovanni D. Rovera, Paesana, both of Italy

[73] Assignee: Andrea DeMarchi, Lessona, Italy

[21] Appl. No.: 866,202

[22] Filed: May 21, 1986

[30] Foreign Application Priority Data

May 20, 1985 [IT] Italy .............................. 20790 A/85

[51] Int. Cl.$^4$ ............................................. H03L 7/26
[52] U.S. Cl. ....................................... 331/3; 331/94.1
[58] Field of Search .................... 331/3, 94.1; 250/251

[56] References Cited

U.S. PATENT DOCUMENTS

| | | | |
|---|---|---|---|
| 2,964,715 | 12/1960 | Winkler | 331/3 |
| 2,972,115 | 2/1961 | Zacharias et al. | 331/3 |
| 3,354,307 | 11/1967 | Holloway et al. | 331/94.1 X |
| 3,407,295 | 10/1968 | Lacey | 331/3 X |

Primary Examiner—Siegfried H. Grimm

Attorney, Agent, or Firm—D. Peter Hochberg

[57] ABSTRACT

The method realizes the frequency control of a frequency standard including an atomic or molecular beam resonance apparatus with two microwave cavities, to which an electromagnetic field is fed, whose frequency is modulated in time with a sinewave signal about an interrogation frequency near to the characteristic resonance frequency of a selected transition of the atoms or molecules of the beam. In the resonance device a current is generated, proportional to the number of atoms or molecules of the beam which have undergone said transition as an effect of their passing through the cavities. The method includes the step of extracting from said current the component whose frequency is an odd harmonic of the modulation frequency of an order higher than the first, in particular the third. Said component is coherently demodulated, in amplitude and sign, to generate a control signal which is used to steer the frequency of said electromagnetic field, in such a way as to minimize the difference between the interrogation frequency and the characteristic resonance frequency of the atomic or molecular transition.

5 Claims, 6 Drawing Figures

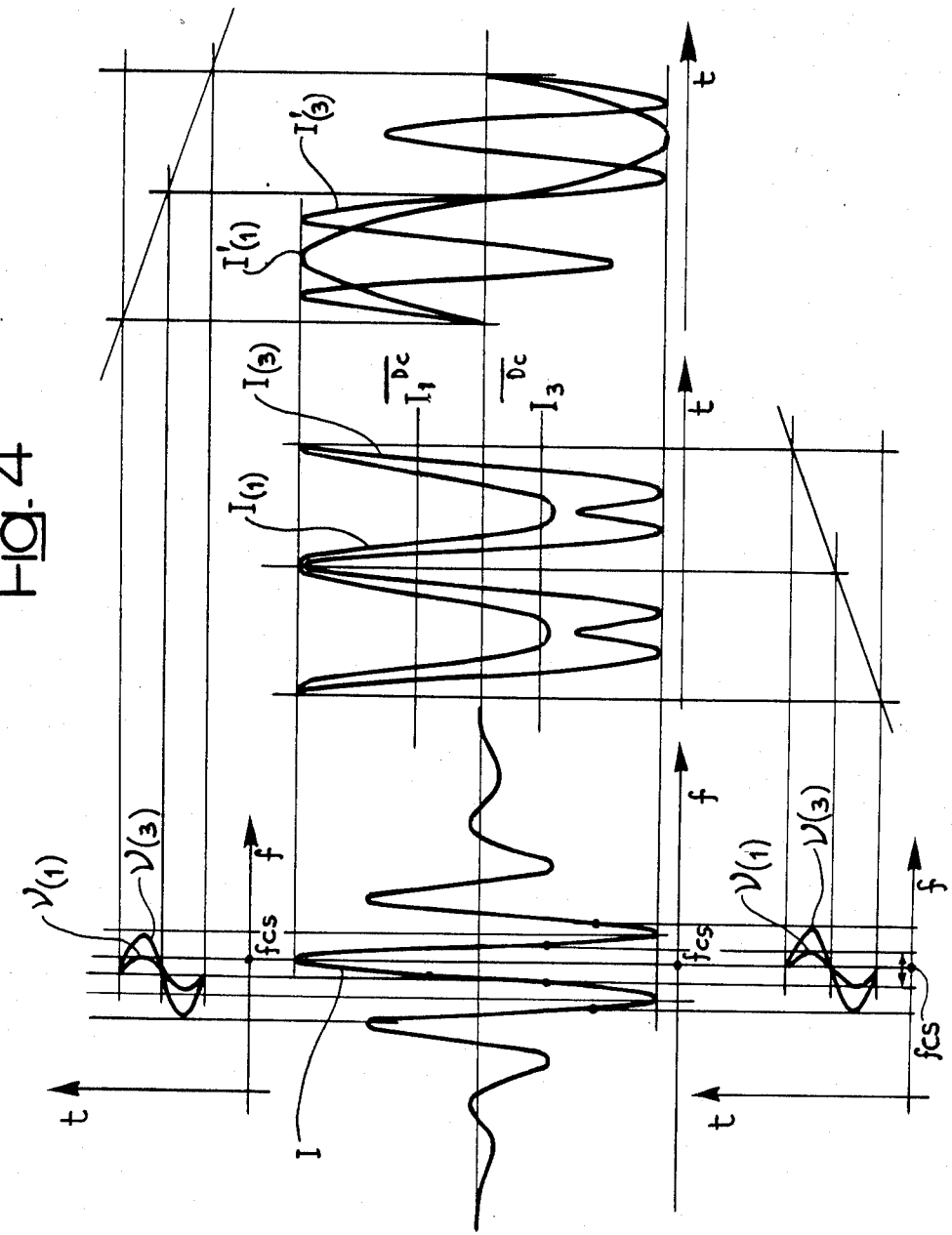

METHOD AND A DEVICE FOR THE FREQUENCY CONTROL OF AN ATOMIC OR MOLECULAR BEAM FREQUENCY STANDARD

The present invention relates to a method for the frequency control of a frequency standard including an atomic or molecular beam device with two microwave cavities, to which an electromagnetic field is fed, whose frequency is modulated in time with a sinewave signal about an interrogation frequency near to the characteristic resonance frequency of a selected transition of the atoms or molecules of the beam, and in which a current is generated, proportional to the number of atoms or molecules of the beam which have undergone said transition as an effect of their passage through the cavities; the method including the steps of:

generating a control signal as a function of a selected characteristic detected in said current, and modifying the frequency of said field as a function of said control signal, in such a way as to minimize the difference between the interrogation frequency and said characteristic resonance frequency.

Such a procedure is currently implemented in Cesium beam devices as disclosed for example in U.S. Pat. Nos. 2,972,115 and 3,354,307.

In FIG. 1 of the enclosed drawings such a device is shown. Said device includes a source 1 (oven) which generates a Cesium atomic beam 2 and sends it through a first pair of deflecting magnetic polepieces 3a and 3b, which generate a strongly dishomogeneous magnetic field. Said magnetic field spatially separates the atoms which are in the energetic state having a given direction of the magnetic moment from the atoms which have the opposite direction of the magnetic moment.

The selected atoms 2a subsequently interact in two successive resonant microwave cavities 4a, 4b, with an electromagnetic radiation of a frequency $\nu$ near to the frequency capable of causing the transition or change of state (inversion of the direction of the "spin" magnetic moment) of said atoms.

The nearer is the frequency of said radiation to the Cesium transition characteristic frequency (9,192,631,770 Hz), the greater is the number of atoms which invert their magnetic moment, that is which change state.

A second pair of deflecting magnetic polepieces 5a, 5b affect the atoms 2a which emerge from the second cavity 4b, in such a way that only the atoms 2b which have undergone the magnetic moment inversion can reach a detector 6.

The detector produces, in a known way, a current I proportional to the number of incoming atoms.

From a functional point of view, the Cesium beam device of FIG. 1 can be considered for the following description as a "block" D (FIG. 2) characterised by a known transfer function which relates the output current I to the input interrogating frequency $\nu$.

Said transfer function is well known and will be further described in the following.

Figure 2:
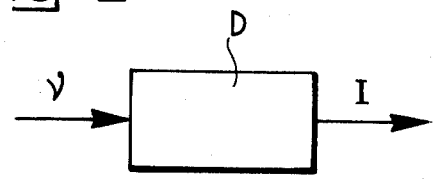
Figure 3:
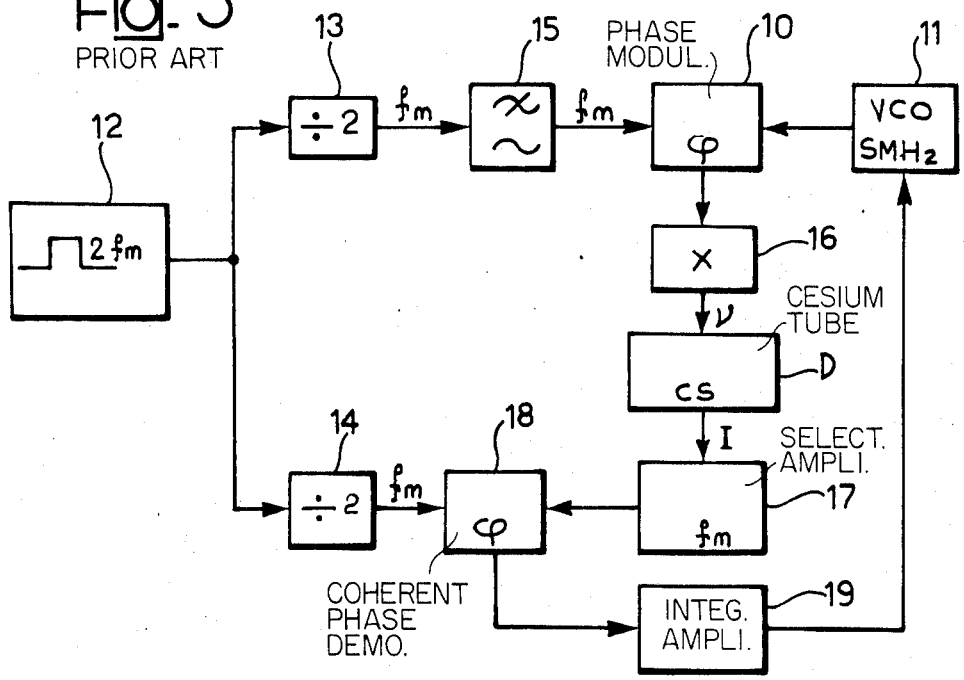

In FIG. 3 a frequency standard is illustrated, including a Cesium tube D of the type described with reference to FIGS. 1 and 2.

In FIG. 3 a phase modulator 10 is shown, which modulates the frequency (for example 5 MHz) of the signal fed thereto by a voltage controlled oscillator (VCO). The frequency of VCO 11 is thus modulated in time by a sinewave having a frequency fm obtained starting from a square wave oscillator 12 at frequency 2 fm.

The output of this oscillator drives two frequency dividers 13, 14, which half the input frequency and emit thus at the output a square wave signal at frequency fm. The output of divider 13 is fed to a low-pass filter 15, whose output provides a practically sinusoidal signal at frequency fm for the modulator 10.

The frequency-modulated signal produced by modulator 10 is elevated in frequency for example by means of a frequency multiplier 16, which provides the Cesium tube D with a signal whose frequency is sinusoidally modulated in time about an interrogation frequency near to the characteristic resonance frequency of Cesium.

The current I generated by the detector 6 is fed to a selective amplifier 17, which extracts and amplifies from said current only the sinewave component whose frequency is the first harmonic of the modulating frequency fed into modulator 10, that is the frequency fm.

The outputs of amplifier 17 and frequency divider 14 are both connected to a coherent phase demodulator 18, of a known type, whose output is fed to an integrator amplifier 19, in turn connected to the control input of VCO 11.

In FIG. 4 of the annexed drawings a series of waveforms is shown to explain the operation of both a Cesium beam frequency standard of known type, and a standard realized according to the present invention.

In particular in FIG. 4 the curve of I shown as a function of the frequency of f is the so-called Ramsey curve (pattern), which is the transfer function of a Cesium beam tube.

Said curve features a central peak at frequency $f_{cs}$, which is 9,192,631,770 Hz for the transition between the $F=3, m_F=0$ and the $F=4, m_F=0$ Zeeman sublevels.

Above and below the Ramsey curve in FIG. 4 are two graphs illustrating the time variation of the modulated frequency fed to the Cesium tube D.

In the graph below the Ramsey curve are shown two different sinusoidal variation of $\nu$, labelled $\nu_{(1)}$ and $\nu_{(3)}$: in both cases the time variation of $\nu$ is centered about $f_{cs}$. Supposing that the frequency of the signal fed to the Cesium tube D be modulated according to $\nu_{(1)}$ or $\nu_{(3)}$ of the lower graph of FIG. 4, the current I generated by detector 6 will have, as a function of time t, the waveforms shown by curves $I_{(1)}$ and $I_{(3)}$ of FIG. 4 respectively.

It can be seen that, if the modulated frequency is perfectly centered about the central peak of the Ramsey curve, the current produced by the detector of the Cesium tube contains only even harmonics of the modulation frequency fm. As a consequence in such a case the selective amplifier 17 has ideally zero output signal and the frequency of VCO 11 is not modified.

On the contrary if the modulated frequency $\nu$ is not centered about the central peak of the Ramsey pattern, as it is shown in the graph above the Ramsey curve in FIG. 4, the detector of the Cesium tube will yield a current with the waveforms shown by curves $I'_{(1)}$ and $I'_{(3)}$ in FIG. 4 respectively.

Curves $I'_{(1)}$ and $I'_{(3)}$ of FIG. 4 show that, if the modulated frequency is not centered on the central Ramsey peak, the current produced by the detector has a content of odd harmonics of the modulation frequency. In particular $I'_{(1)}$ shows mostly a first harmonic content. In this case the selective amplifier 17 of FIG. 3 is tuned to extract from current I the component at frequency fm, which is then demodulated in amplitude and sign by the coherent phase demodulator 18.

At the output of the latter appears then a signal at frequency 2 fm, which is basically a doublewave rectified sinewave of frequency fm. This signal is amplified and integrated in amplifier 19 and is then used to steer the frequency of VCO 11.

However the above described way of operation of the standard shown in FIG. 3 is somewhat idealized since the effect of the Cesium transitions adjacent to those at frequency $f_{cs}$ has not been taken into account.

Figure 5:
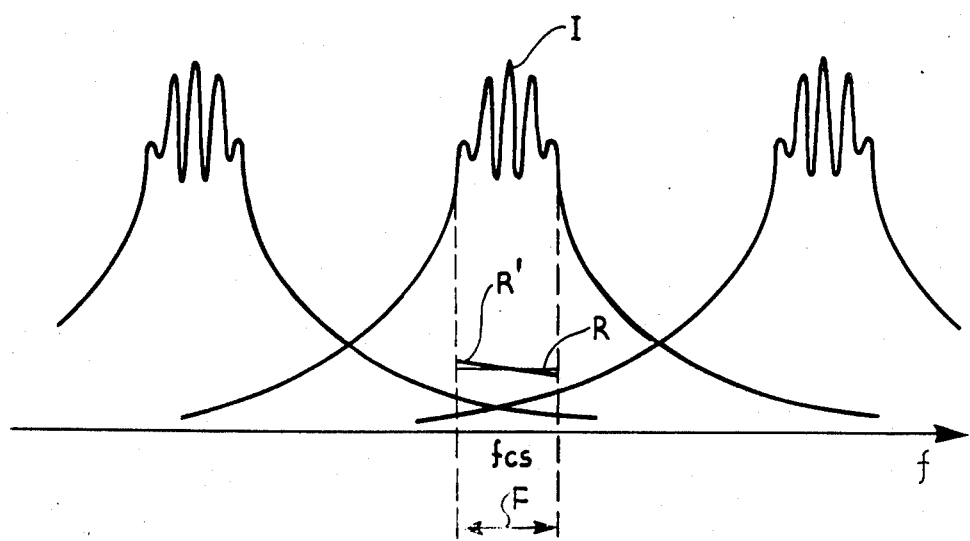

FIG. 5 shows the so-called Rabi curves which illustrate the output current I from the tube D as a function of the frequency f on the abscissae, for the three central transitions of Cesium atoms. The central Rabi line, centered on frequency $f_{cs}$ corresponds to the transitions between the above indicated Zeeman sublevels.

The curve on the left instead corresponds to the transition between the $F=4, m_F=-1$ and the $F=3, m_F=-1$ sublevels, whereas the curve on the right corresponds to the transition between the $F=4, m_F=1$ and the $F=3, m_F=1$ sublevels.

In the ideal case these two side curves are equal and symmetric about the central curve, and in the frequency interval F centered about the center Ramsey peak the "wings" or "tails" of the side curves (which in that interval can be well approximated by a straight segment) add up, giving as a result a horizontal straight segment, labelled R in FIG. 5.

However in the real case the tails of said curves corresponding to the adjacent transitions add up giving as a result in the interval F a straight segment R' with a finite slope, generally different from zero.

In the ideal case the effect of the adjacent transitions gives no problem: as already pointed out their combined transfer function is given by a horizontal straight segment, which does not change the harmonic content of the tube's output current.

In the real case the combined transfer function of the adjacent wings instead has generally a non-zero slope; therefore such transitions induce a first-harmonic content in the tube's output current I even when the modulated frequency $\nu$ is actually centered on the characteristic frequency of the excited transition.

In general the transitions adjacent to the transition used as a reference introduce therefore a bias error in the frequency of the standard; since such bias may change with time, it may therefore limit both the accuracy and the long term stability of the standard.

The object of the present invention is to allow the realization of frequency standards of higher accuracy, better repeatability and long-term stability, and higher insensitivity to the environmental conditions. The latter may in fact affect the shape of the Rabi lines, for example through the power of the microwave field in the cavities.

The said object is achieved according to the invention, with a method for the frequency control of a frequency standard of the above specified type, characterized by the fact that from said tube's output current a component is extracted, whose frequency is an odd harmonic higher than the first of the frequency fm modulating the interrogation frequency $\nu$, and that the control signal is generated by coherently demodulating said component, in amplitude and sign. Furthermore the invention relates to a device for the frequency control of a frequency standard of the above specified type, whose main features are summarized in the appended claims.

Finally, the invention also relates to a frequency standard including such a control device.

Figure 6:
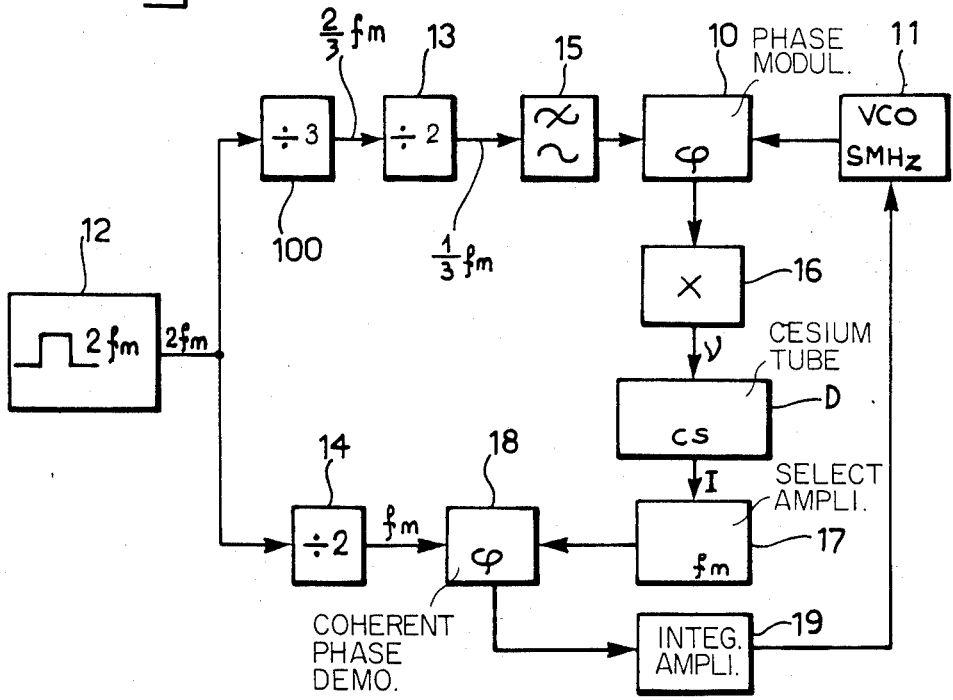

Further features and advantages of the present invention will appear from the following detailed description, which is given with reference to the appended drawings, supplied merely as a nonlimitative example, in which:

FIG. 1, already described, schematically illustrates a Cesium beam frequency standard, the already described FIG. 2 and FIG. 3 show a schematic functional representation of a Cesium beam tube according to FIG. 1 and, respectively, the block diagram of a frequency standard according to prior art, including a Cesium beam tube, the already described FIG. 4 shows several graphs which explain how a Cesium beam tube works, the already described FIG. 5 shows the Rabi curves for a Cesium tube, corresponding to the actually used center transition and to the two adjacent ones, and FIG. 6 shows the block diagram of a frequency standard including a Cesium beam tube, modified according to the present invention.

In FIG. 6 parts already described with reference to FIG. 5 have been given the same reference numbers.

In FIG. 6, between the oscillator 12 and the frequency divider 13 a further frequency divider 100 is inserted, which divides by 3 the frequency of the signal fed to its input. As a consequence divider 13 provides at its output a symmetric square wave at frequency fm/3.

The filter 15 provides therefore modulator 10 with a sinewave modulating signal which is also at frequency fm/3.

Also in this case the selective amplifier 17 connected to the output of the Cesium tube is tuned to extract the component at frequency fm. However, in this case, said frequency is the third harmonic of the modulating frequency.

If the modulated frequency fed to the Cesium tube D is actually centered on the characteristic frequency $f_{cs}$, the selective amplifier 17 yields at its output a signal which is practically zero. In fact the current I has a content of even harmonics only, which are rejected by the selective amplifier 17, plus a small component at the modulating frequency fm/3, caused by the adjacent transitions, which is also rejected by the selective amplifier 17.

If on the contrary the modulated frequency fed to the tube D is not centered on frequency $f_{cs}$, the current I has a waveform of the type shown by curve $I'_{(3)}$ in FIG. 4, with a strong component at the frequency fm corresponding to the third harmonic of the modulating frequency. This third harmonic component is coherently demodulated and integrated to generate the frequency control signal for VCO 11. Also in this case the contribution of the adjacent transitions gives no problem, because it is a component of current I at frequency fm/3 which is rejected by the selective amplifier 17. Therefore according to the invention it is possible to improve the accuracy and long-term stability by using coherent detection of the third harmonic of the frequency which modulates the microwave frequency fed to the cavities of the Cesium tube.

Resorting to third harmonic detection to overcome the problems caused by a sloping background signal has been already proposed and realized for other applications, in particular for the frequency stabilization of lasers in saturated absorption spectroscopy.

In the specific field of atomic beam frequency standards third harmonic detection not only was never proposed, but, on the contrary, was generally thought not to be viable, because it was believed that the amplitude of the detected third harmonic would be too much smaller than the amplitude of the detected fundamental frequency, and that as a consequence the loss in signal-to-noise ratio would be not acceptable.

Such was the general opinion of the experts in the field, and in particular even of the inventors, as is reported for example in the paper "Pulling by neighbouring transitions and its effects on the performance of Cesium beam frequency standards", published in Metrologia, 20, 37–47 (1984).

In critically reviewing such opinion, generally shared by the experts of the field, the inventors first derived analytically and then verified experimentally that the signal-to-noise ratio obtainable in a third harmonic loop is practically equal to that obtained in a first harmonic loop.

FIG. 6, by comparison with FIG. 5, immediately suggests how existing frequency standards can be easily and quickly modified to include third harmonic detection and earn the advantages deriving therefrom.

Naturally, the principle of the invention remaining the same, the embodiments and details of realisation may be varied widely with respect to those described and illustrated purely by way of non-limiting example, without thereby departing from the scope of the present invention.

I claim:

1. A method for the frequency control of a frequency standard including an atomic or molecular beam device with two cavities to which an electromagnetic field is fed, whose frequency is modulated in time in a substantially sinusoidal way about an interrogation frequency near to the characteristic frequency of a selected transition of the atoms or molecules of said beam, and in which device a current is generated proportional to the number of atoms or molecules of the beam which have undergone said transition as an effect of their passage through the cavities; the method including the phases of:

generating a control signal as a function of a preselected detected characteristic of said current, and modifying the frequency of said field as a function of said control signal, in such a way as to minimize the difference between said characteristic frequency and the interrogation frequency, the improvement therein is in the fact that from said current the component is extracted whose frequency is an odd harmonic, higher than the first, of the frequency which modulates the interrogation frequency, and that said control signal is generated by coherently demodulating said component, in amplitude and sign.

2. The method according to claim 1, wherein from said current the component is extracted whose frequency is the third harmonic of the frequency which modulates the interrogation frequency.

3. A device for the frequency control of an atomic or molecular beam frequency standard including two microwave cavities, controlled generator means capable of feeding to said cavities an electromagnetic field at a frequency periodically modulated in time with a sinewave about a variable interrogation frequency near to said characteristic frequency of a preselected transition of the atoms or molecules of the beam, a source capable of sending a beam of atoms or molecules through said cavities, a detector capable of generating a current proportional to the number of atoms or molecules which have undergone said transition; the control device including means for generating a control signal as a function of a preselected detected characteristic of said current, said control signal being usable to modify the frequency of said field in such a way as to minimize the difference between said characteristic frequency and the interrogating frequency, said means for generating a control signal including a detecting circuit capable of extracting from said current the component whose frequency is a preselected-odd harmonic, higher than the first, of the frequency which modulates the interrogation frequency, and a demodulator connected to said detecting circuit and capable of demodulating said component in amplitude and sign.

4. The device according to claim 3, wherein said detecting circuit is tuned to extract from said current the component whose frequency is the third harmonic of the frequency which modulates the interrogation frequency.

5. An atomic or molecular beam frequency standard including a control device according to claims 3 or 4.

* * * * *